(12) United States Patent
Srinivasan et al.

(10) Patent No.: US 6,369,729 B1
(45) Date of Patent: Apr. 9, 2002

(54) COMMON MODE SHIFT IN DOWNSTREAM INTEGRATORS OF HIGH ORDER DELTA SIGMA MODULATORS

(75) Inventors: Vishnu S. Srinivasan; Jason Rhode, both of Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/415,294

(22) Filed: Oct. 8, 1999

(51) Int. Cl.[7] .............................................. H03M 3/02
(52) U.S. Cl. ...................................... 341/143; 341/155
(58) Field of Search ........................... 341/143, 61, 145, 341/155, 118, 120

(56) References Cited

U.S. PATENT DOCUMENTS 4,772,871 A * 9/1988 Suzuki et al. ............... 341/155
5,654,711 A * 8/1997 Fujimori ..................... 341/143
5,818,374 A   10/1998 Tan
5,886,586 A * 3/1999 Lai et al. .................... 332/109

OTHER PUBLICATIONS

Lansirinne M., et al.; "A 2.5V 50 MHz Delta–Sigma–Modulator for Digital Cellular Telephones"; Midwest Symposium on Circuits and Systems, U.S., New York, NY; IEEE, Aug. 3, 1997, pp. 1165–1168.

* cited by examiner

Primary Examiner—Peguy JeanPierre
Assistant Examiner—Joseph Lauture
(74) Attorney, Agent, or Firm—Blakely Sokoloff Taylor & Zafman

(57) ABSTRACT

A technique for shifting a common mode voltage in a modulator comprised of a plurality of differential stages, so that downstream stages can use a lower voltage drive than the first stage of the modulator.

29 Claims, 5 Drawing Sheets

COMMON MODE SHIFT IN DOWNSTREAM INTEGRATORS OF HIGH ORDER DELTA SIGMA MODULATORS

BACKGROUND OF THE INVENTION

1. Field of the Invention

The present invention relates to the field of converter circuits and, more particularly, to high order modulator circuits.

2. Background of the Related Art

The use of analog-to-digital converters (A/D converters or ADCs) to convert analog signals into digital signals is well known in the art. State-of-the-art practice is to fabricate an ADC on a single integrated circuit chip. Generally, an ADC samples an analog signal at a sampling rate which is twice the highest frequency component being sampled. This is known as the Nyquist rate. The sampled signal is processed and converted into a digital format for output from the converter.

A particular type of ADC employs an oversampling technique in which the analog input signal is sampled at a much higher rate than the Nyquist rate. The higher sampling rate improves the performance of the ADC for signal conversion and processing. One commonly used oversampling type of ADC uses a delta-sigma ($\Delta\Sigma$) modulator for oversampling the analog input. The oversampled output of the $\Delta\Sigma$ modulator is coupled to a decimator, which employs a low-pass filtering technique to extract the lower frequency components to generate a converted digital output signal at the Nyquist rate. The $\Delta\Sigma$ modulators generally employ multiple integrator stages for providing the signal conversion.

It is appreciated that a typical high order modulator for a mixed-signal circuit utilizes a large number of digital switches. For example, when switched capacitor sampling circuits are utilized to sample the input signal, four switches are typically used with the sampling capacitor for each stage of the modulator. In a fifth-order $\Delta\Sigma$ modulator, there are five integrator stages present, each with a switched capacitor input sampling circuit. When differential integrator stages are used, at least eight switches are typically required for the sampling operation of each integrator stage.

In order to reduce power consumption in a chip, devices are designed to operate at lower supply voltages. Low power devices are desirable for applications where power drain is a concern. A lap-top (or notebook) computer, which uses a battery power source, is an example. However, the switches may not turn on at these lower voltages, if the gate voltage is not appreciably different from the source/drain voltage. To alleviate this turn-on problem, prior art modulators use a voltage booster (such as a voltage doubler) to drive the gates of the switches to ensure that the switches turn on. However, boosting the voltage for switch activation increases the power consumption in the device, as well as increasing the area on the device to accommodate the boosting circuitry.

The present invention implements a technique which allows certain stages of the modulator to operate at lower voltages in order to reduce power consumption in a mixed-signal modulator.

SUMMARY OF THE INVENTION

A modulator comprised of a plurality of differential stages for converting an input signal is described. A range of the input to the modulator is such that the first stage requires a common mode voltage that requires a boosted supply voltage to clock the input transistor switches. The outputs of the downstream integrators are typically smaller so as to enable a common mode that is closer to either the supply voltage or its return. Accordingly, a non-boosted voltage can be utilized for the gate drive of the downstream integrator stages, which results in lower power consumption and less chip area for the voltage boost circuitry of the modulator, thus making the modulator implementation more power/area efficient at lower supply voltages.

DETAILED DESCRIPTION OF THE INVENTION

Figure 1:
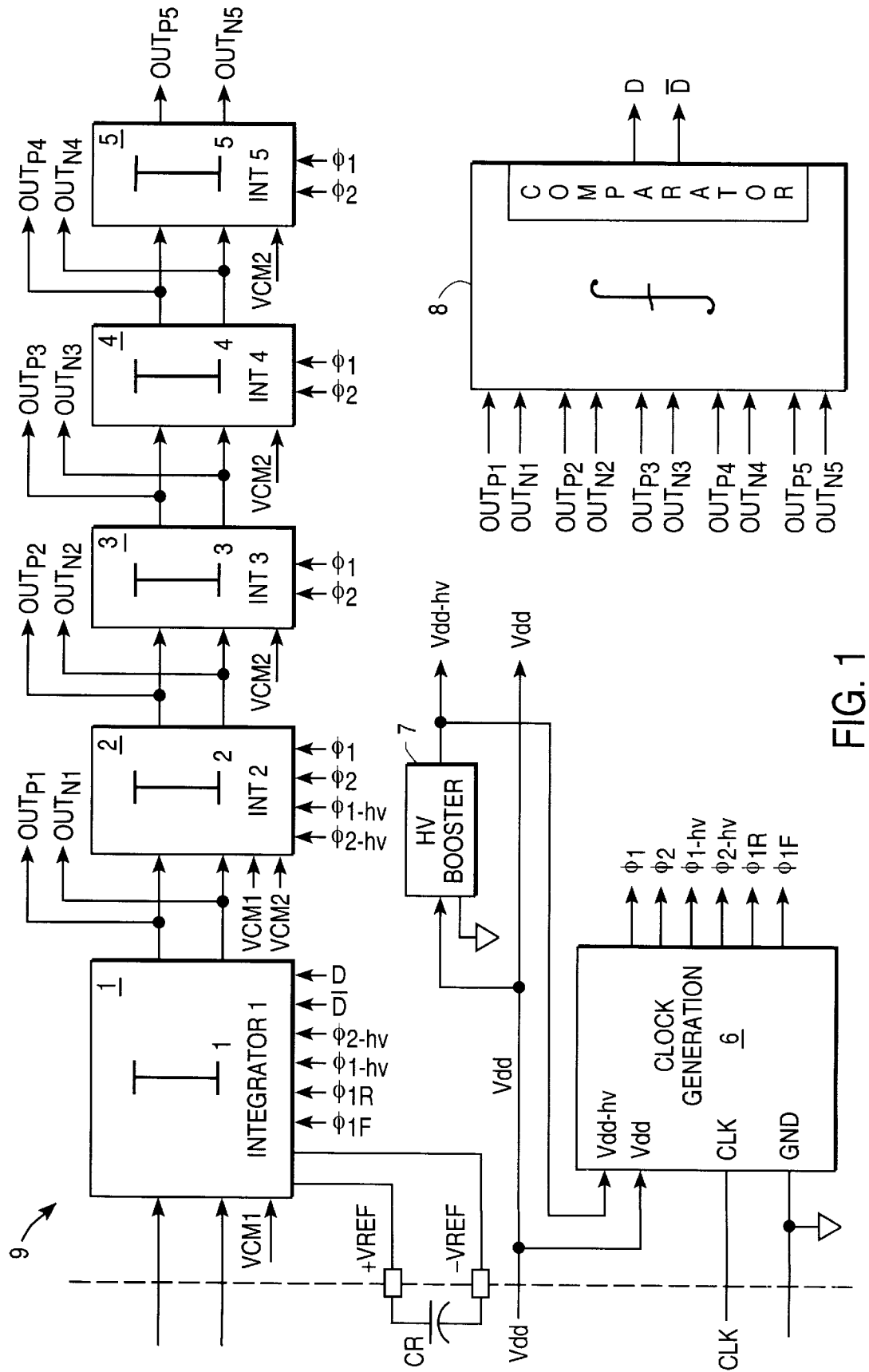
FIG. 1 is a block schematic diagram of a high order modulator incorporating the present invention.

Referring to FIG. 1, a high-order modulator 9 for use in signal conversion is shown. In the particular example, modulator 9 is a delta-sigma ($\Delta\Sigma$) modulator used in an analog-to-digital converter (ADC). The $\Delta\Sigma$ modulator shown is a fifth-order modulator having five integrator stages 1–5, which are also identified as stages $I_1$–$I_5$. The first stage $I_1$ receives an analog input signal and commences the sampling procedure. A reference voltage $V_{REF}$, typically coupled to an external filtering capacitor, is used as a reference voltage for the analog input signal at the first stage. The integrator stages are coupled serially, so that a differential output from a given stage (noted as $OUT_{P1}$ and $OUT_{N1}$ for the positive and negative differential outputs from stage $I_1$, $OUT_{P2}$ and $OUT_{N2}$ for stage $I_2$, etc.) is fed as an input to the next stage. Each stage output is also coupled to a summation network 8 to generate a final output from a comparator, which is included within the summation network 8. The output D from the network 8 is either a 1 or a 0 (the digital states). Thus, for each sampled input of the analog signal, a digital output D is provided. It is appreciated that the basic concept of a $\Delta\Sigma$ modulator is known in the art.

Figure 2:
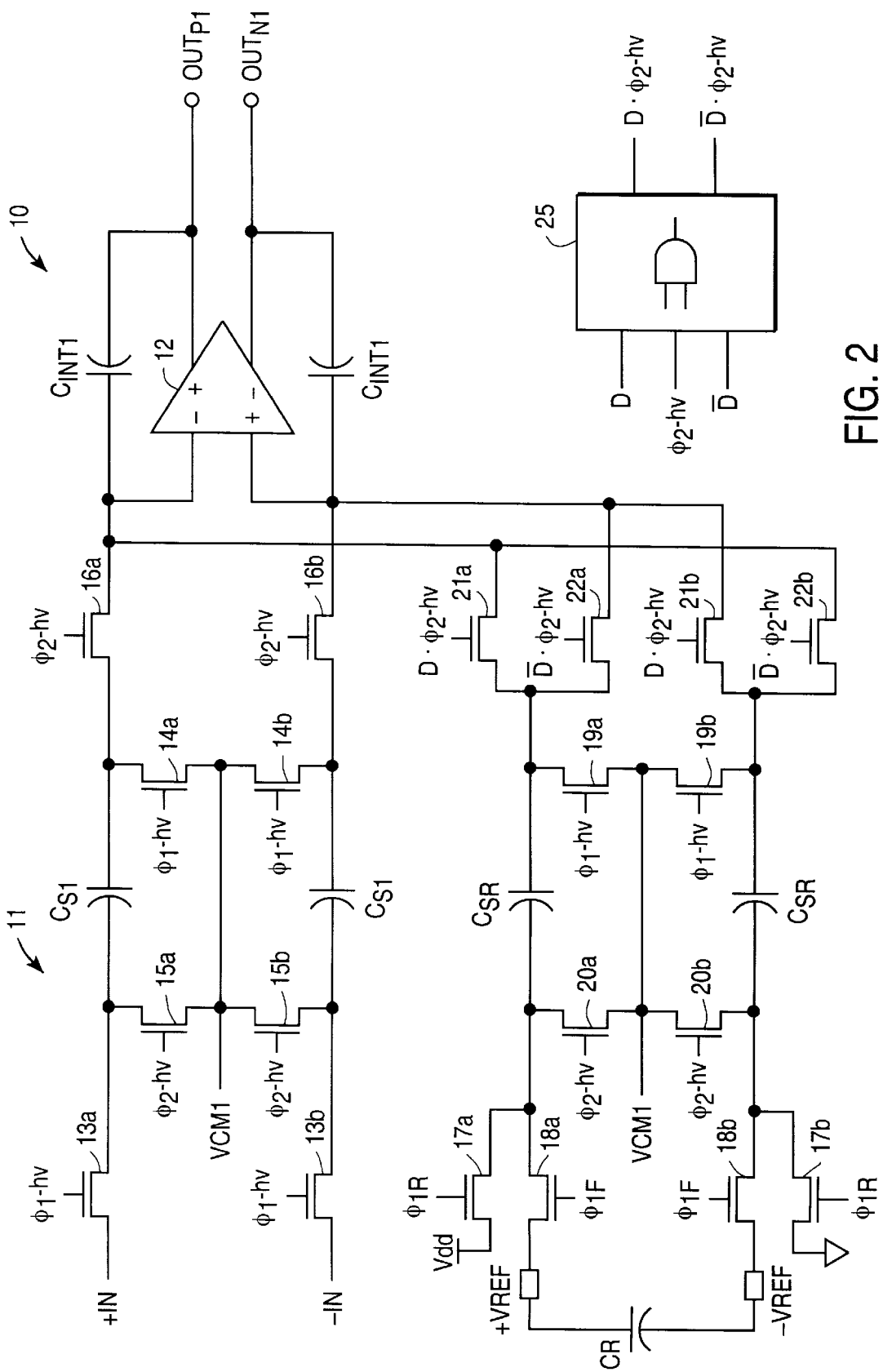
FIG. 2 is a circuit schematic diagram of a first integrator stage of the modulator illustrated in FIG. 1.
Figure 3:
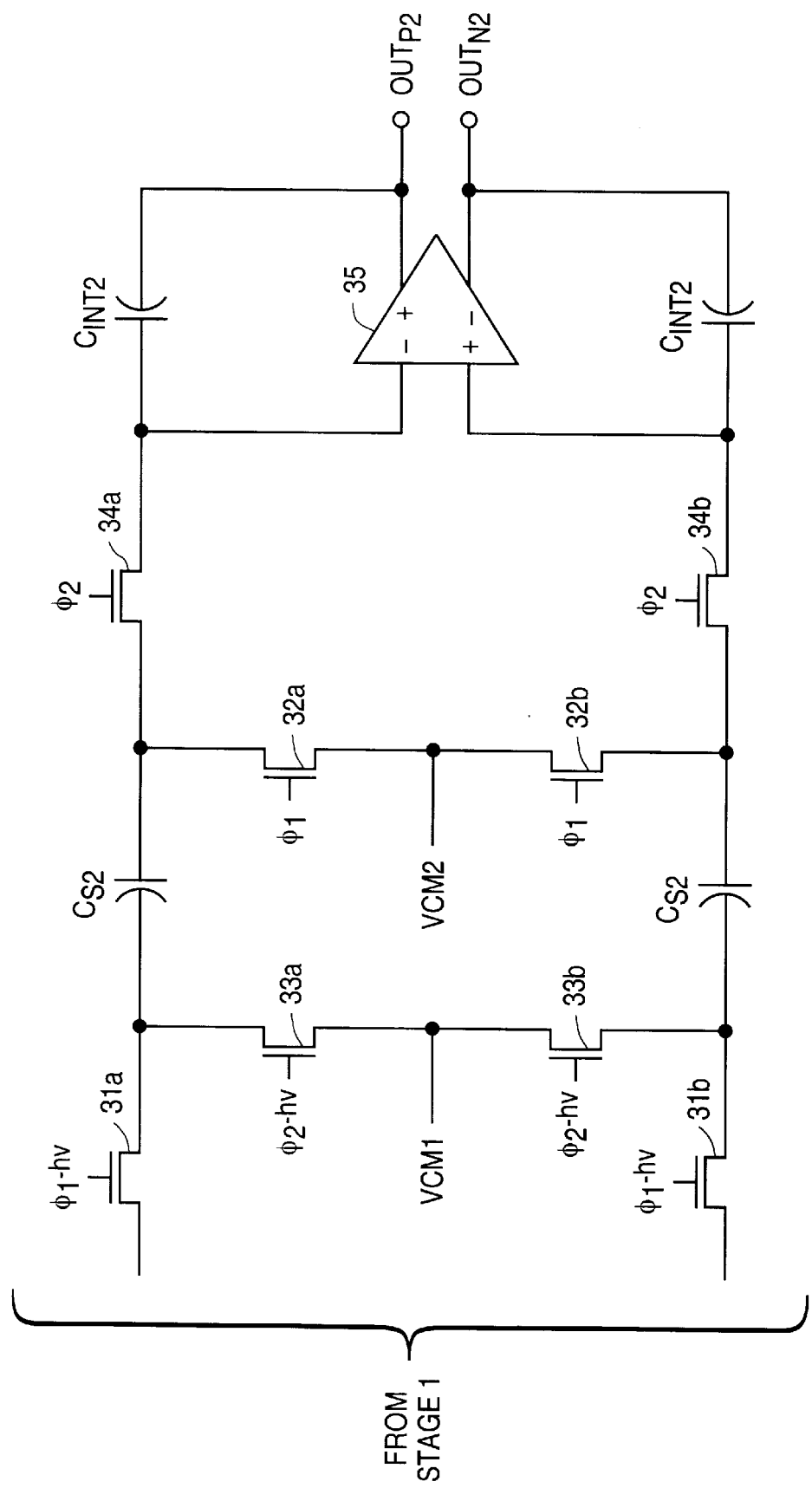
FIG. 3 is a circuit schematic diagram of a second integrator stage of the modulator illustrated in FIG. 1.
Figure 4:
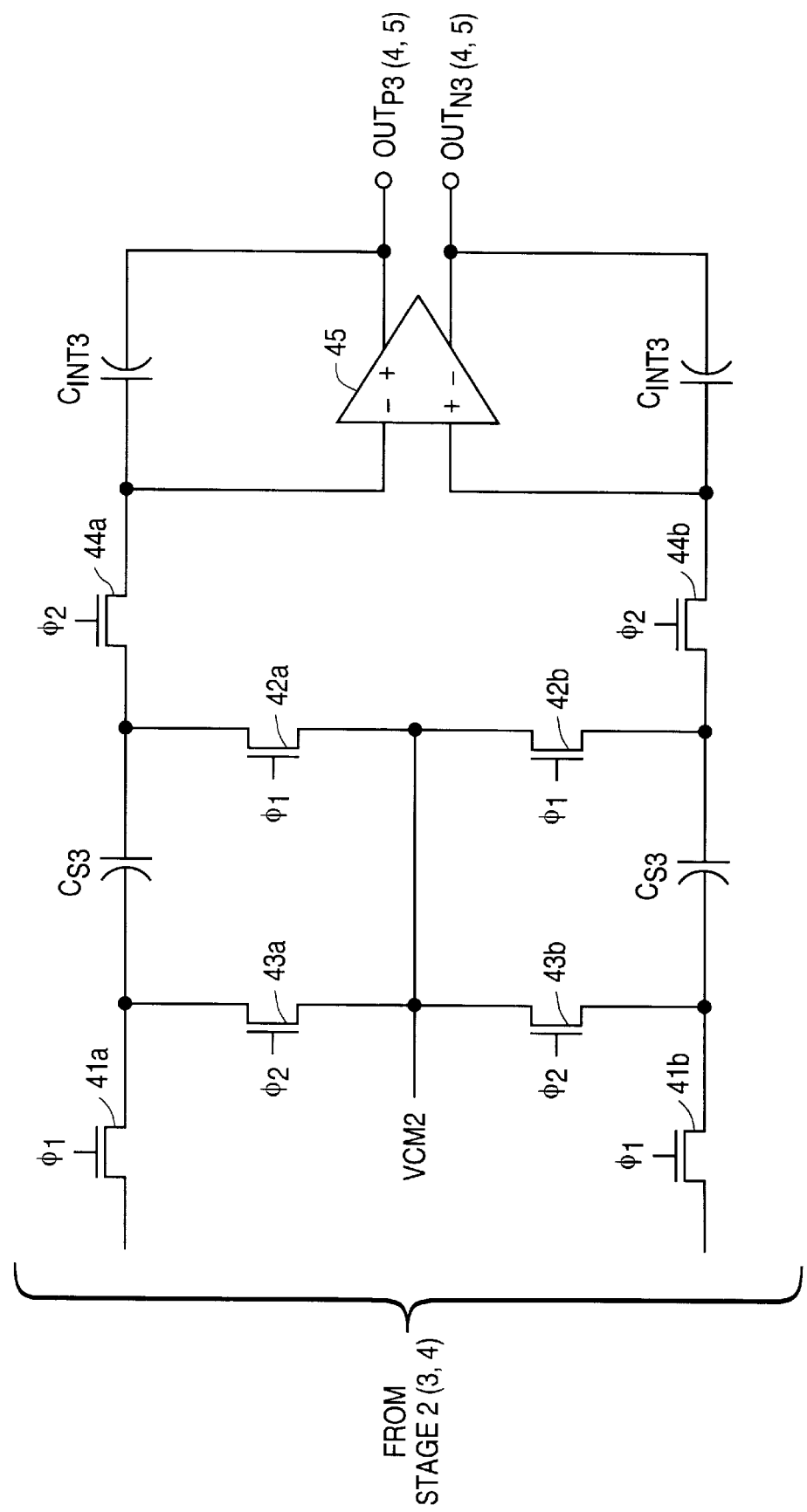
FIG. 4 is a circuit schematic diagram of a third and subsequent integrator stage of the modulator illustrated in FIG. 1.

Although the concept of a $\Delta\Sigma$ modulator is known, the modulator 9 of FIG. 1 implements the present invention as described below in reference to the circuitry shown in FIGS. 2–4. FIG. 2 shows the integrator for stage 1, FIG. 3 shows the integrator for stage 2 and FIG. 4 shows the integrator for each of the last three stages 3–5. It is appreciated that there are other circuit components within each of the stages 1–5, but only the circuitry relevant to understanding the present invention are illustrated in FIGS. 2–4.

Also shown in FIG. 1 are a clock generation circuit 6 and a supply voltage booster circuit 7. The clock generation circuit 6 receives a reference clocking signal CLK and generates the various clocking signals required by the integrators 1–5. The various clocking signals shown are discussed below in reference to the other Figures. The voltage booster circuit 7 is utilized to boost (such as double) the supply voltage Vdd coupled to the device. The boosted supply voltage (higher voltage) is noted as "hv", such as Vdd−hv. In the example, $\phi_1$ and $\phi_2$ signals switch between Vdd and ground. The other clock signals having −hv appended, switch between Vdd−hv and ground.

The summation network 8 receives the outputs from each of the integrator stages 1–5 to provide a summation which is compared to the common mode voltage in the included comparator to derive a digital signal, which corresponds to the analog signal sampled. The digital output D is also used as a feedback signal to stage 1 to control the polarity of the +$V_{REF}$ and −$V_{REF}$ signals being applied to the input of the stage 1 integrator.

Shown in FIG. 1 are two common mode voltages $V_{CM1}$ and $V_{CM2}$. $V_{CM1}$ is coupled to stage 1 and 2. $V_{CM2}$ is coupled to stage 2 and beyond. As will be described below, $V_{CM1}$ is used with stage 1 where the drive voltages are all boosted voltages. Stage 2 receives and operates with both $V_{CM1}$ and $V_{CM2}$. The remaining stages operate having the common mode of $V_{CM2}$. As will be described, the shifting of the common mode voltage at stage 2 allows circuitry using $V_{CM2}$ for the common mode to operate at a lower (non-boosted) supply voltage drive.

In FIG. 2, an integrator circuit 10 is shown having two sets of switched capacitor input sampling circuitry, which are coupled to a summation node at the input of the integrator 12. The switched capacitor integrator circuit 10 is a fully-differential integrator in which a switched capacitor input circuitry 11 is used to sample a differential input (+IN and −IN). An integrator 12, having integrating capacitors $C_{INT1}$ in each of the feedback paths from the differential output ($OUT_{P1}$ and $OUT_{N1}$) to the input, provide the integration of the sampled analog input. The input circuit is comprised of a sampling capacitor $C_{S1}$ for each input line of the differential input for sampling the analog signal. The frequency of the sampling is determined by the operation of transistor switches, which closing/opening is synchronized to clocking signals $\phi_1$ and $\phi_2$ to switch in/out the sampling capacitors. During time $\phi_1$ the input is sampled by the sampling capacitors, and during $\phi_2$ the sampled signal is coupled to the input of the integrator 12. The common connection is noted as $V_{CM1}$ to denote the common mode voltage of the differential amplifier.

The example circuit 10 utilizes transistors 13a,b–15a,b (also referred to as switches, due to the switching action of the transistors) to perform the switching operation on the sampling capacitor $C_{S1}$. The $\phi_1$ and $\phi_2$ clock signals on the gate of the transistor switches control the activation of these transistors. The "hv" designation denotes the higher voltage applied to the gate of these transistors during each of the phase periods $\phi_1$ or $\phi_2$. Therefore in FIG. 1, the gate drivers of the transistors 13a,b–16a,b are $\phi_1$−hv or $\phi_2$−hv clocking signals. The "a" and "b" designations are used to differentiate the two sides of the differential circuit. Therefore, during $\phi_1$ switches 13a,b and 14a,b close to sample the analog input signal (switches 15a,b and 16a,b are open). During $\phi_2$ switches 15a,b and 16a,b close to transfer the sampled input to the integrator 12 (switches 13a,b and 14a,b are open).

It is to be noted that an alternative technique is to provide delayed clocking phases of $\phi_1$ and $\phi_2$ to some of the switches in order to improve the performance of the switching circuitry. For example, $\phi_1$d−hv (delayed $\phi_1$−hv) is used to clock switches 13a,b and $\phi_2$d−hv (delayed $\phi_2$−hv) is used to clock switches 15a,b. The delay is a short delay, typically in the nanosecond range. Furthermore, similar delayed clocking scheme can be applied with the input switches 31a,b and 33a,b in FIG. 3 and 41a,b and 43a,b in FIG. 4.

Furthermore, the integrator stage 1 is generally the most critical stage in a ΔΣ modulator. To obtain better performance, a completely symmetric and differential setup is preferred. For example, $V_{CM1}$ should equal Vdd/2, so that $OUT_{P1}$ and $OUT_{N1}$ can have the largest symmetrical swing.

In order to provide the sampling, the input signal is sampled and compared to a reference voltage $V_{REF}$. Typically, the +$V_{REF}$ and the −$V_{REF}$ terminals are coupled to an external capacitor $C_R$, in ordered to provide a filtered voltage as a reference source. The +$V_{REF}$ and the −$V_{REF}$ terminals are coupled to a pair of sampling capacitors $C_{SR}$ during $\phi_1$, when switches 19a,b and either switches 17a,b or 18a,b close. During $\phi_2$ the sampled signal is coupled to the input of the integrator 12, when switches 20a,b and either switches 21a,b or 22a,b close, where it is summed with the sampled input signal at the integrator input nodes. The +$V_{REF}$ and the −$V_{REF}$ lines are coupled to the integrator 12 input by the operation of switches 21a,b and 22a,b, according to an one-bit data output D of the modulator 9.

For example, if the feedback is "1", then the +$V_{REF}$ is coupled to the minus input of the integrator 12 and if the feedback is "0", the +$V_{REF}$ is coupled to the plus input. That is, switches 21a,b close during time period $\phi_2$ when D=1 and switches 22a,b close when D=0. In the example circuit 10, a logic circuit 25 is used to provide the AND logic function of D and $\phi_2$−hv, as well as D# (# denoting a complement of D and shown as a bar over D in the Figures) and $\phi_2$−hv to generate the D·($\phi_2$−hv) and (D#)·($\phi_2$−hv) to activate switches 21a,b and 22a,b respectively.

During $\phi_1$ the switches 19a,b close. Also during $\phi_1$ switches 17a,b and 18a,b close, but not at the same time. The switches 17a,b and 18a,b are operated by the clocking signals $\phi_{1R}$ and $\phi_{1F}$. The $\phi_{1R}$ signal transitions high and closes switches 17a,b first, allowing the input summing nodes to charge/discharge toward Vdd/GND. Then switches 17a,b open after a selected time delay and switches 18a,b close with the transition to $\phi_{1F}$. This technique allows rough (R) charging/discharging of the reference capacitor $C_R$ nodes initially, followed by a fine (F) leveling of the voltage +$V_{REF}$/−$V_{REF}$ at the reference capacitor nodes. The coarse or rough charging/discharging (by the closing of switches 17a,b) allows DC voltages to be used to bring the integrator input nodes faster toward the appropriate $V_{REF}$ value (which is Vdd), so that when the actual filtered $V_{REF}$ potential is switched in, only a fine adjustment is required. This technique inhibits large load swings to be impressed on the $V_{REF}$ reference lines, which swings could cause performance degradation and harmonic distortion in the modulator. As noted earlier, the "hv" designation denotes a "high voltage" signal. Typically, the signals $\phi_1$ and $\phi_2$ are clocking signals switching between the supply voltage Vdd and its return Vss (which is ground in this instance). When the clocking signal is in the high state, Vdd is placed on the gate of the transistor and the transistor is turned on to pass the signal through. When the clocking signal is in the low state, ground is placed on the gate and the transistor is turned off. The common mode voltage $V_{CM1}$ is generally set at Vdd/2.

When the supply voltage operates at a higher level (such as at 5 V), the transistors have no difficulty turning on when Vdd is placed on the gate. Since the common mode is set at 2.5 V, a 1 V rms (1.4 V peak) signal variation implies a source/drain voltage of 1.09 V on a n-channel (3.91 V on a p-channel) transistor. With a gate drive of 5 V (0 V for p-channel), the transistor is turned on sufficiently. However, at some lower threshold, Vdd on the gate is too low in value to activate the transistor. For example, if the device is designed for operation at a supply voltage of 1.8 V, the common mode voltage drops to 0.9 V. Even half of the previous input signal variation of 0.707 V about the common mode voltage results in an input signal variation in the range of 0.193–1.607. With 1.607 V at the input and only 1.8 V on the gate, the transistor will not turn on. Thus, a voltage booster circuit is used to boost the clock signals which gate the transistor switches. With a voltage doubler, the Vdd of 1.8 V is boosted to provide a clocking signal of 3.6 V to turn on the transistor. In actual practice, a boost to about 3.0 volts is achieved to turn on the transistors.

Thus, as noted in FIG. 2, the clocking signals to the gates of the transistor switches have their signal levels boosted. This allows a Vdd of 1.8 volts as the supply voltage for the device (chip), but the voltage boosting is used where necessary to ensure activation of the transistor switches. However, it is appreciated that voltage boosting increases the power consumption by the transistor switches.

In the practice of the present invention, the very first stage 1 utilizes boosted clocking voltages on the gate of the transistor switches 13a,b–22a,b. The boosting is desirable since the input signal as well as the output of the integrator stage 1 may fluctuate substantially, as noted in the example above and boosting may be required to turn on the transistor switches. However, the subsequent stages 2–5 do not fluctuate as much as the first stage. Rather, the outputs from the subsequent stages 2–5 remain much closer to the common mode, so that any variations in signal output is not as drastic as the first stage. Accordingly, a technique of the present invention is used to permit later stages of the modulator 9 to have a different common mode voltage than the first stage. This allows the normal supply voltage value Vdd to drive the gates of the transistors of the later stages. The voltage boosting is not required to drive the gates of the transistor switches of these remaining stages.

In FIG. 3, an integrator circuit for stage 2 is shown. An input sampling circuit, comprised of transistor switches 31a,b–34a,b and sampling capacitors $C_{S2}$ along with integrator 35, operate equivalently to the input switched capacitor sampling circuit of FIG. 2, but with a notable difference. The common mode voltage for the circuitry to the input side of the $C_{S2}$ capacitor has the common mode voltage of $V_{CM1}$. The common mode for the circuitry to the integrator side of $C_{S2}$ has a different common mode voltage $V_{CM2}$. Furthermore, the switches which operate with the $V_{CM1}$ common mode voltage (which are switches 31a,b and 33a,b) still have their gates driven by the boosted clocking signal voltage of $\phi_1$-hv or $\phi_2$-hv. However, the switches which operate with the $V_{CM2}$ common mode voltage (which are switches 32a,b and 34a,b) now utilize the normal Vdd value for the clocking signal. Thus gates of switches 32a,b and 34a,b operate on the normal (non-boosted) clocking signals $\phi_1$ and $\phi_1$ (and not the $\phi_1$-hv and $\phi_2$-hv). As noted previously, switches 31a,b and 33a,b can be delayed.

Since the input signal swing remains very close to the common mode voltage, the circuitry past the sampling capacitor $C_{S2}$ of stage 2 can operate at the normal unboosted gate drive on the transistor switches. However to ensure that the transistor switches are turned on, the $V_{CM2}$ value is set to some value below $V_{CM1}$. In the example, since $V_{CM1}$ is set to Vdd/2, $V_{CM2}$ is set to a value somewhere near Vdd/4.

Referring to FIG. 4, an integrator circuit for use in subsequent integrator stages is shown. The circuit of FIG. 4 is equivalent to the circuit in FIG. 3, except that now all of the transistors 41a,b–44a,b are driven by the normal unboosted clocking signals $\phi_1$ or $\phi_2$. Again, $\phi_1$ and $\phi_2$ signals to the gates of the transistors 41a,b and 43a,b can be delayed. However, in this instance the delayed signals are the unboosted $\phi_1$d and $\phi_2$d (not $\phi_1$-hv or $\phi_2$-hv). Thus, stages 3–5 utilize the circuit of FIG. 4, in which unboosted clocking signals drive the gates of transistors 41a,b–44a,b. The circuitry uses the $V_{CM2}$ common mode voltage, which in the example is in the vicinity of Vdd/4.

It is appreciated that the invention shifts the common mode voltage to a lower value at one of the integrator stages, so that subsequent integrator stages can use the lower common mode voltage. In the example, the common mode shift occurs in the integrator stage 2. Due to the DC blocking property of capacitors, the sampling capacitor at stage 2 is used as the demarcation for the common mode shift. Stage 2 is selected for initiating the common mode shift, since integrator outputs from stage 2 and beyond remain very close to the common mode value. The shifting of the second common mode voltage to a value below the first allows the transistor switches to be driven by the normal unboosted supply voltage. Only the gate drives of the transistors having the higher common mode require the voltage boost. Accordingly, by reducing the gate drives of some of the stages, power consumption is decreased and chip area required for the voltage boosting circuitry of the modulator is also decreased.

It was noted above that low-power mixed-signal devices (on semiconductor chips) operating at low supply voltages need boosted clocks (or gate drive control signals) to turn on n-channel transistors or switches adequately. These boosted signals can either be derived from boosted clock doubler circuits or by having clocks or control signals level-shifted up to the boosted supply in which case, a separate boosted supply generator is required. Regardless of the implementation, by having fewer switches that need boosted supply drive, power savings (due to a smaller capacitive load off the boosted supply and less crank-through current in the level-shifters as well) can be achieved. In the second implementation, by having fewer switches and hence a smaller load capacitance, smaller filtering and pump capacitors are required in the voltage boost circuitry, resulting in less chip layout area. Overall, the fewer switches that have to be run off the boosted supply, the less power and area are required for the voltage boost circuit.

The invention is described above implementing NMOS transistor devices. However, the invention can be implemented using PMOS devices as well. In that instance, the drive signals and voltage values will be patterned for differential circuits using PMOS transistors. Thus, for example, the $V_{CM1}$ voltage would still be Vdd/2, but $V_{CM2}$ will now be Vdd-(Vdd/4). The PMOS transistors will be driven when the drive is low (ground in the example) and the clock phases will be inverted. Otherwise, the circuitry operates equivalently to the NMOS circuitry described above.

Figure 5:
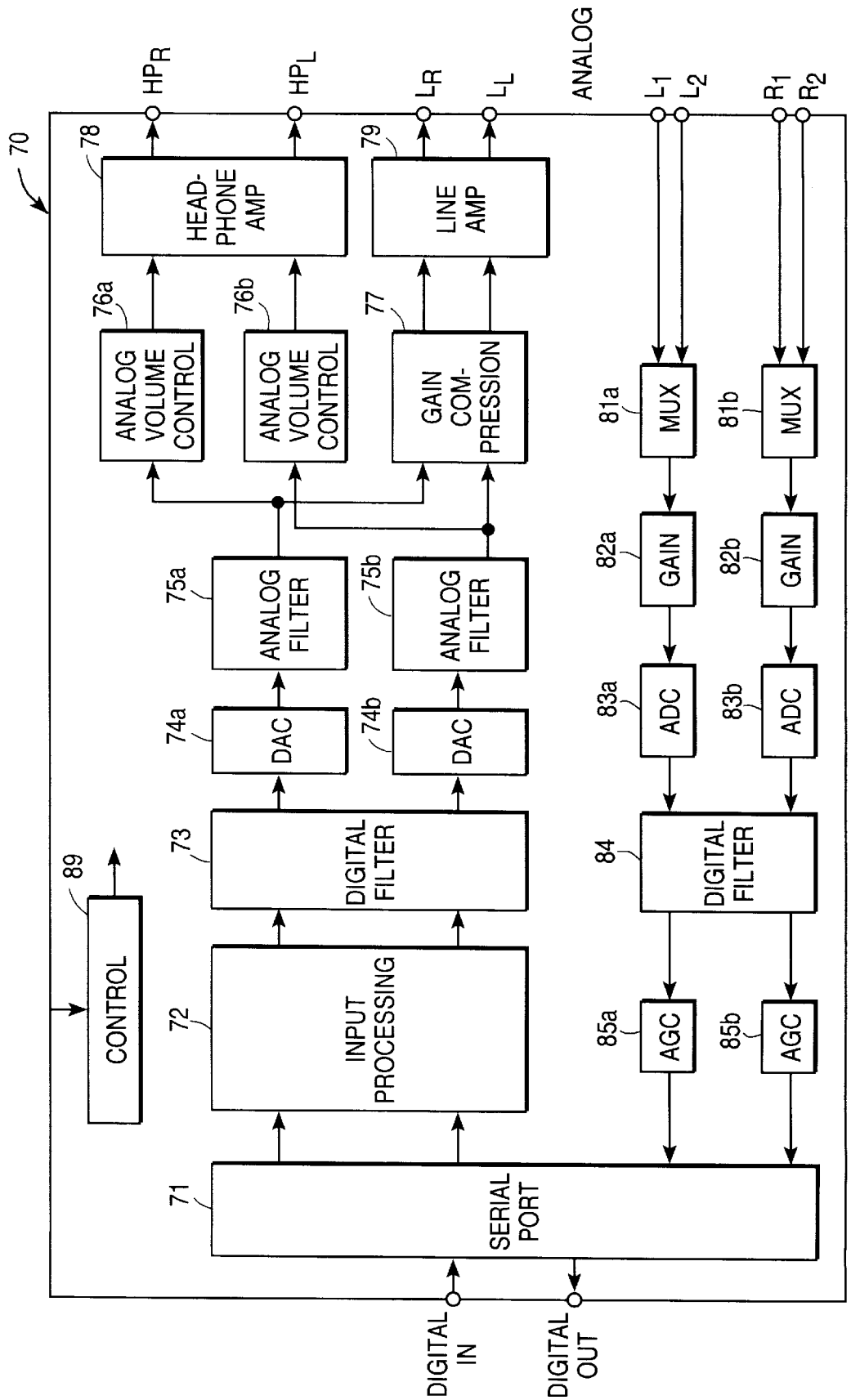
FIG. 5 is a block schematic diagram of a CODEC which implements the modulator incorporating the present invention.

It is appreciated that the modulator comprising the present invention can be utilized in a variety of ways and implemented in a variety of systems. In FIG. 5, a low-voltage, stereo audio coder-decoder (CODEC) integrated circuit chip 70 is shown in which digital input/output is at the left and the analog input/output is at the right. A serial port receives a digital input and separates the right (R) and left (L) channels of the stereo signal. The signals are coupled to an input processing circuit 72. The circuit 72 provides de-emphasis, volume control, base/treble control, boost, compression limiting etc. and sends the signal to a digital filter 73, prior to signal conversion. The filtered digital signals are converted to analog signals by a pair of DACs 74a,b. The DACs 74a,b utilize ΔΣ modulators for providing the conversion. The converted outputs are filtered by a pair of analog filters 75a,b to remove the high sampling frequencies and retrieve the lower frequency audio analog signals.

The R and L analog outputs are coupled to respective volume controls 76a,b, which when amplified by a headphone amplifier 78, provides stereo audio outputs ($HP_R$ and $HP_L$) to a headphone coupled to the chip 70. The analog outputs are also coupled to a gain compression circuit 77 before being amplified by a line amplifier 79 to provide line outputs ($L_R$ and $L_L$).

In the opposite direction for signal processing, stereo analog inputs are received at L1/L2 and R1/R2 terminals. The R and L analog inputs are coupled to a pair of multiplexers (MUXs) 81a,b, for selecting between different inputs. After the gain is adjusted by a pair of gain amplifiers 82a,b, the analog signals are coupled to a pair of ADCs 83a,b. The ADCs 83a,b also utilize $\Delta\Sigma$ modulators for high frequency sampling to provide the conversion. A digital filter 84 is used to remove the high frequency component and retrieve the converted filtered signal. The digital signal is processed by an automatic gain control (AGC) circuit by respective AGC circuits 85a,b, then coupled to the serial port 71 for providing a digital output from the chip 70.

Also, noted is a control circuit 89, which receives control signals from an external circuitry and generates necessary on-chip signals. It is appreciated that other signal lines and terminals are not shown, but are understood to be present for operation of the chip 70. Such signals include, clocking signals, reset signals, supply voltages and grounds.

In the particular example, the modulator 9 incorporating the invention is implemented in the ADCs 83a and 83b. The CODEC 70 is capable of operating with a supply voltage in the approximate range of 1.6–3.6 volts. Accordingly, the CODEC 70 is suitable for use in portable devices, such as portable audio CD (compact disk) players, MPs and MD recorders and other portable systems that require extremely low power consumption.

It is appreciated that an ADC is described above to illustrate an implementation of the present invention. However, the invention need not be limited to such application only. The shifting of the common mode voltage for the downstream integrator stages allows for operation of those stages at a lower supply drive voltage than the first stage. The lower voltage operation of the switches results in lower power consumption for the device.

Thus, a common mode shift in downstream integrators of high order modulators is described. The particular example described is in reference to a delta-sigma modulator used in an analog-to-digital converter. However, the invention can be readily used in other applications which utilize differential circuitry and/or where the common mode of the signal at different points are such that the common mode can be translated to avoid the need for boosted clock generators.

Furthermore, it is to be noted that the invention is described in reference to a fully-differential integrator circuit. However, single-ended circuitry can be utilized to obtain equivalent differential results. For example, the circuit of FIG. 2 can be adapted for single-ended input by connecting the +IN and −IN terminals together to receive a single-ended input, but having the clock drives to the gates of switches 13b and 15b reversed. Therefore, switch 13b is now gated by $\phi_2$-hv and switch 15b is now gated by $\phi_1$-hv. The resulting operation of this circuit is equivalent to the differential circuit described in FIG. 2. Thus, other circuit implementations can readily implement the present invention.

We claim:

1. An apparatus comprising:
a modulator comprised of a plurality of differential stages for converting an input signal, said modulator operating at a particular supply voltage, but in which at least one of the differential stages requires boosting the supply voltage to a greater magnitude for operation of said modulator;

said modulator having a first common mode voltage for the differential stage requiring the boosted supply of greater magnitude, but having the first common mode voltage shifted to a second common mode voltage for the stage or stages not having the boosted supply voltage; and a clocking circuit for generating clock signals to drive each of the stages, the clock signals including a boosted signal of greater magnitude for driving the stage having the first common mode voltage and non-boosted signal for driving the stage or stages having the second common mode voltage.

2. The apparatus of claim 1 wherein said modulator is an oversampling type modulator.

3. The apparatus of claim 2 wherein said modulator is utilized for analog to digital conversion.

4. The apparatus of claim 1 wherein said modulator is a high order delta-sigma modulator.

5. The apparatus of claim 4 wherein said modulator has its first stage operating at the first common mode voltage, its second stage shifting the first common mode voltage to the second common mode voltage and subsequent stages operating at the second common mode voltage.

6. A modulator for signal conversion comprising:
a first differential integrator stage to receive an input signal and to commence a conversion of the input signal, said first differential integrator stage to have a first common mode voltage;

a second differential integrator stage coupled to receive an output of said first integrator stage to perform a second stage of the conversion, said second differential integrator stage to shift the first common mode voltage to a second common mode voltage within said second stage;

one or more subsequent differential integrator stage or stages coupled subsequent to said second differential integrator stage to perform the conversion and to have the second common mode voltage; and the second common mode voltage to allow said subsequent integrator stage or stages to operate at a drive voltage lower than a drive voltage for said first integrator stage.

7. The modulator of claim 6 wherein each of said differential integrator stages has a switched capacitor sampling circuit at its input, in which a common coupling of switches of the switched capacitor sampling circuit is either the first or second common mode voltage, depending on said integrator stage.

8. The modulator of claim 7 wherein said second integrator stage utilizes the first common mode voltage prior to a sampling capacitor of the sampling circuit and utilizes the second common mode voltage past the sampling capacitor.

9. The modulator of claim 8 is a high order delta-sigma modulator.

10. The modulator of claim 9 wherein the first common mode voltage is approximately half of the drive voltage for said first integrator stage and the second common mode voltage is less than the first common mode voltage.

11. An analog-to-digital converter comprising:
a first differential integrator stage to receive an analog input signal and to commence a conversion of the analog input signal, said first differential integrator stage to have a first common mode voltage;
a second differential integrator stage coupled to receive an output of said first integrator stage to perform a second stage of the conversion, said second differential integrator stage to shift the first common mode voltage to a second common mode voltage within said second stage;
one or more subsequent differential integrator stage or stages coupled subsequent to said second differential integrator stage to perform the conversion and to have the second common mode voltage; and
the second common mode voltage to allow the subsequent integrator stage or stages to operate at a drive voltage lower than a drive voltage for the first integrator stage when the integrator stages function as a high order modulator for analog-to-digital conversion.

12. The analog-to-digital converter of claim 11 wherein said differential integrator stages form an oversampling type modulator.

13. The analog-to-digital converter of claim 11 wherein said differential integrator stages form a high order delta-sigma modulator.

14. The analog-to-digital converter of claim 13 wherein each of said differential integrator stages has a switched capacitor sampling circuit at its input, in which a common coupling of switches of the switched capacitor sampling circuit is either the first or second common mode voltage, depending on said integrator stage.

15. The analog-to-digital converter of claim 14 wherein said second integrator stage utilizes the first common mode voltage prior to a sampling capacitor of the sampling circuit and utilizes the second common mode voltage past the sampling capacitor.

16. The analog-to-digital converter of claim 15 wherein the first common mode voltage is approximately half of the drive voltage and the second common mode voltage is less than the first common mode voltage.

17. A method of shifting common mode voltage in a modulator having multiple integrator stages comprising:
providing a first common mode voltage to a first integrator stage of the modulator;
providing a second common mode voltage to a second and subsequent integrator stages;
shifting common mode voltage from the first common mode voltage to the second common mode voltage in the second stage; and
driving the stage or stages having the first common mode voltage with a boosted supply voltage and driving the stage or stages having the second common mode voltage with a non-boosted supply voltage.

18. The method of claim 17 wherein said shifting of the common mode voltage is achieved in the second stage by having switching devices on one side of a sampling capacitor operate at the first common mode voltage and switching devices on an opposite side of the sampling capacitor operate at the second common mode voltage.

19. The method of claim 18 wherein the first stage and portion of the second stage prior to the sampling capacitor have their switching devices driven by a boosted supply voltage drive and the remaining portion of the second stage and any subsequent stage or stages have their switching devices driven by a non-boosted supply voltage drive.

20. The method of claim 19 further including the converting of an analog signal when the stages form an oversampling type modulator.

21. The method of claim 19 further including the converting of an analog signal when the stages form a high order delta-sigma modulator.

22. A method of reducing power consumption in a high order modulator used in signal conversion comprising:
providing a first common mode voltage to a first integrator stage of the modulator;
providing a second common mode voltage to a second and subsequent integrator stages;
shifting common mode voltage from the first common mode voltage to the second common mode voltage in the second stage; and
driving the stage or stages having the first common mode voltage with a boosted supply voltage and driving the stage or stages having the second common mode voltage with a non-boosted supply voltage, which requires less power consumption in the driving of the stages.

23. The method of claim 22 wherein said shifting of the common mode voltage is achieved in the second stage by having switching devices on one side of a sampling capacitor operate at the first common mode voltage and switching devices on an opposite side of the sampling capacitor operate at the second common mode voltage.

24. The method of claim 23 wherein the first stage and portion of the second stage prior to the sampling capacitor have their switching devices driven by a boosted supply voltage drive and the remaining portion of the second stage and any subsequent stage or stages have their switching devices driven by a non-boosted supply voltage drive.

25. The method of claim 24 further including the converting of an analog signal when the stages form an oversampling type modulator.

26. The method of claim 24 further including the converting of an analog signal when the stages form a high order delta-sigma modulator.

27. A method of reducing chip area in a high order modulator used in signal conversion comprising:
providing a first common mode voltage to a first integrator stage of the modulator;
providing a second common mode voltage to a second and subsequent integrator stages;
shifting common mode voltage from the first common mode voltage to the second common mode voltage in the second stage; and
driving the stage or stages having the first common mode voltage with a boosted supply voltage and driving the stage or stages having the second common mode voltage with a non-boosted supply voltage, which requires less power consumption in the driving of the stages.

28. The method of claim 27 wherein said shifting of the common mode voltage is achieved in the second stage by having switching devices on one side of a sampling capacitor operate at the first common mode voltage and switching devices on an opposite side of the sampling capacitor operate at the second common mode voltage.

29. The method of claim 28 wherein the first stage and portion of the second stage prior to the sampling capacitor have their switching devices driven by a boosted supply voltage drive and the remaining portion of the second stage and any subsequent stage or stages have their switching devices driven by a non-boosted supply voltage drive.

* * * * *